(12) United States Patent
Yatsui et al.

(10) Patent No.: US 8,027,713 B2
(45) Date of Patent: Sep. 27, 2011

(54) MAGNETIC RESONANCE IMAGING APPARATUS AND IMAGE PROCESSING METHOD

(75) Inventors: Yumiko Yatsui, Chiba (JP); Tetsuhiko Takahashi, Chiba (JP)

(73) Assignee: Hitachi Medical Corporation, Tokyo (JP)

( * ) Notice: Subject to any disclaimer, the term of this patent is extended or adjusted under 35 U.S.C. 154(b) by 998 days.

(21) Appl. No.: 10/474,313

(22) PCT Filed: Apr. 11, 2002

(86) PCT No.: PCT/JP02/03614
§ 371 (c)(1),
(2), (4) Date: Oct. 7, 2003

(87) PCT Pub. No.: WO02/082994
PCT Pub. Date: Oct. 24, 2002

(65) Prior Publication Data
US 2004/0135577 A1 Jul. 15, 2004

(30) Foreign Application Priority Data
Apr. 11, 2001 (JP) ................................. 2001-112765

(51) Int. Cl.
*A61B 5/05* (2006.01)
(52) U.S. Cl. ........ 600/419; 600/410; 324/309; 324/307; 324/312
(58) Field of Classification Search .................. 600/407, 600/410, 437, 419; 324/300–310, 312
See application file for complete search history.

(56) References Cited

U.S. PATENT DOCUMENTS

| 4,797,615 | A | | 1/1989 | Rotem et al. | |
|---|---|---|---|---|---|
| 5,078,141 | A | * | 1/1992 | Suzuki et al. | 600/422 |
| 5,144,235 | A | | 9/1992 | Glover et al. | |
| 5,432,447 | A | * | 7/1995 | Song | 324/309 |
| 5,485,085 | A | | 1/1996 | Sumanaweera et al. | |
| 5,783,942 | A | * | 7/1998 | Bernstein et al. | 324/306 |
| 6,150,973 | A | * | 11/2000 | Pritt | 342/25 C |
| 6,263,228 | B1 | * | 7/2001 | Zhang et al. | 600/409 |
| 6,603,990 | B2 | * | 8/2003 | Zhang et al. | 600/410 |
| 6,714,807 | B2 | * | 3/2004 | Zur | 600/410 |

(Continued)

FOREIGN PATENT DOCUMENTS
EP 470845 A 2/1992
(Continued)

OTHER PUBLICATIONS

European Office Action, dated May 6, 2010, issued in corresponding European Patent Application No. 02 717 115.6.
(Continued)

*Primary Examiner* — Brian Casler
*Assistant Examiner* — Joel M Lamprecht
(74) *Attorney, Agent, or Firm* — Atonelli, Terry, Stout & Kraus, LLP.

(57) ABSTRACT

A magnetic resonance imaging apparatus having control unit for fetching a plurality of image data and obtaining an image by a calculation. The control unit performs an unwrap processing to a plurality of regions for removing a main value of a phase rotation amount so as to obtain a distribution diagram of a phase rotation amount caused by magnetostatic unevenness, obtains a plurality of evaluation values based on the phase value between a plurality of regions, selects a desired evaluation value based on the phase value from the plurality of evaluation values, and adjusts the phase values between the regions in accordance with the desired evaluation value.

14 Claims, 7 Drawing Sheets

U.S. PATENT DOCUMENTS

| | | | |
|---|---|---|---|
| 6,728,568 B1 * | 4/2004 | Yatsui et al. | 600/410 |
| 6,906,515 B2 * | 6/2005 | Yatsui et al. | 324/309 |
| 2003/0060697 A1 * | 3/2003 | Zhang et al. | 600/410 |
| 2004/0010191 A1 * | 1/2004 | Yatsui | 600/410 |
| 2004/0056660 A1 * | 3/2004 | Yatsui et al. | 324/309 |

FOREIGN PATENT DOCUMENTS

| | | |
|---|---|---|
| JP | 2-84934 A | 3/1990 |
| JP | 4-288142 A | 10/1992 |
| JP | 5-317286 A | 12/1993 |
| JP | 2000-237160 | 9/2000 |
| JP | 2001-204711 A | 7/2001 |
| WO | WO 01/55741 A | 8/2001 |

OTHER PUBLICATIONS

International Search Report issued in Int'l Appln. No. PCT/JP02/03614, May 21, 2002.

* cited by examiner

Fig. 1

Fig. 2
REGION OF OBJECT TO BE EXAMINED

MAGNETIC RESONANCE IMAGING APPARATUS AND IMAGE PROCESSING METHOD

TECHNICAL FIELD

The present invention relates to a magnetic resonance imaging apparatus (hereinafter referred to as a MRI apparatus); and, more particularly, the invention relates to a technique for accurately obtaining a water/fat separated image of each of two or more island-like regions included in one image.

BACKGROUND OF THE INVENTION

When a magnetic resonance imaging apparatus is used to obtain an image, images showing the contrast between various tissues can be obtained by changing the parameters of the time of echo (TE), the time of repetition (TR), and performing image calculations. The methods of obtaining an image having such contrast include the Dixon method. The Dixon method is a method of obtaining a water/fat separated image by utilizing the phase change of water MR signals and fat MR signals in one region.

Recently, in clinical settings, opportunities for imaging both right and left crural regions at the same time, or of imaging a transverse cross section of the brain-basilar region of the head, or of imaging a coronal cross-section of the abdomen, are increasing in diagnosing from a water/fat separated image. A conventional technique of accurately obtaining a water/fat separated image, when the imaging region is separated into a plurality of island-like portions because the object to be examined includes a plurality of spatially-separated portions, or the object includes portions that product no signals, such as those of air, is disclosed in "A New Two-Dimensional Phase Unwrapping Algorithm for MRI Images", by M. Hedley and D. Rosenfeld, in Magnetic Resonance in Medicine, Vol. 24, 177-181 (1992). According to this technique, when there are two island-like regions, only the phases of the points of the first region and the second region closest to each other are simply compared. However, with such a technique, since it is difficult to obtain a desired image of a portion where there is a local rapid change of phases, or where the island-like regions are greatly separated, the water image and the fat image cannot be separated, and portions where the water signals are extracted and portions where the fat signals are extracted are mixed up in one image.

SUMMARY OF THE INVENTION

The object of the present invention is to provide a magnetic resonance imaging apparatus that can suppress the generation of artifacts between imaging regions, even when one image includes two or more regions that are separated from each other. According to this invention, a magnetic resonance imaging apparatus is provided, which includes control means for acquiring data of a plurality of images having various echo times and for obtaining an image by calculation, wherein the control means adjusts phase values between respective portions using an evaluation function based on the phase values of the respective portions.

The numerical reference 101 represents an object to be examined; the numerical reference 102 represents a static magnetic field magnet; the numerical reference 103 represents a gradient magnetic field coil; the numerical reference 104 represents an RF coil; the numerical reference 105 represents an RF probe; the numerical reference 106 represents a signal detection unit; the numerical reference 107 represents a signal processing unit; the numerical reference 108 represents a display unit; the numerical reference 109 represents a gradient magnet field power source; the numerical reference 110 represents an RF transmission unit; the numerical reference 111 represents a control unit; and the numerical reference 112 represents a bed.

BEST MODE FOR CARRYING OUT THE INVENTION

Figure 1:
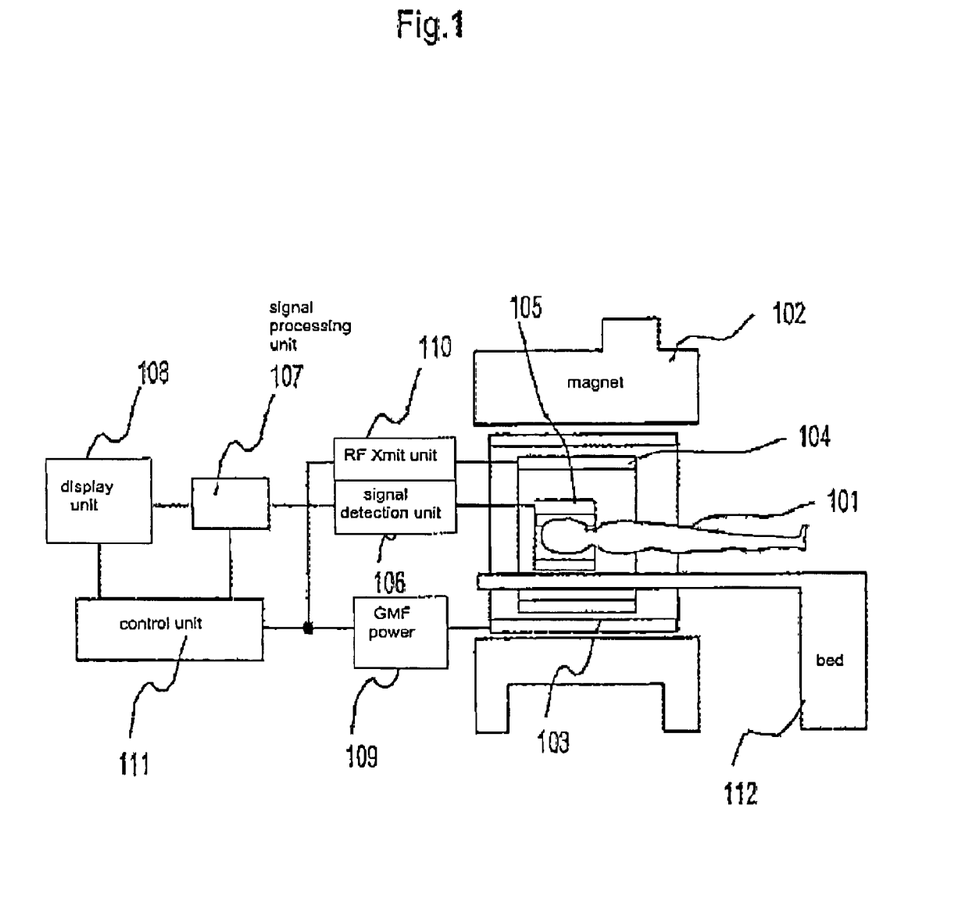
FIG. 1 is a block diagram showing the basic structure of an MRI apparatus.

The structure of an MRI apparatus will be described with reference to FIG. 1. The apparatus includes a magnet 102 for generating a static magnetic field around an object 101 to be examined; a gradient magnetic field coil 103 for generating gradient magnetic fields in the space; an RF coil 104 for generating an RF magnetic field in the space; and an RF probe 105 for detecting MR signals generated from the object 101. The gradient magnetic field coil 103 consists of three gradient magnetic field coils, disposed respectively in the X, Y, and Z directions, and each of them generates a gradient magnetic field in response to signals from a gradient magnetic field power source 109. The RF coil 104 generates an RF magnetic field in response to signals from an RF transmission unit 110. Signals from the RF probe 105 are detected by a signal detection unit 106, are subjected to signal processing in a signal processing unit 107, and are converted into image signals by calculation. The image is displayed on a display unit 108. The gradient magnetic field power source 109, the RF transmission unit 110, and the signal detection unit 106 are controlled by a control unit 111. The time chart of the control is generally referred to as a pulse sequence. A bed 112 is designed to support the object during examination.

Figure 2:
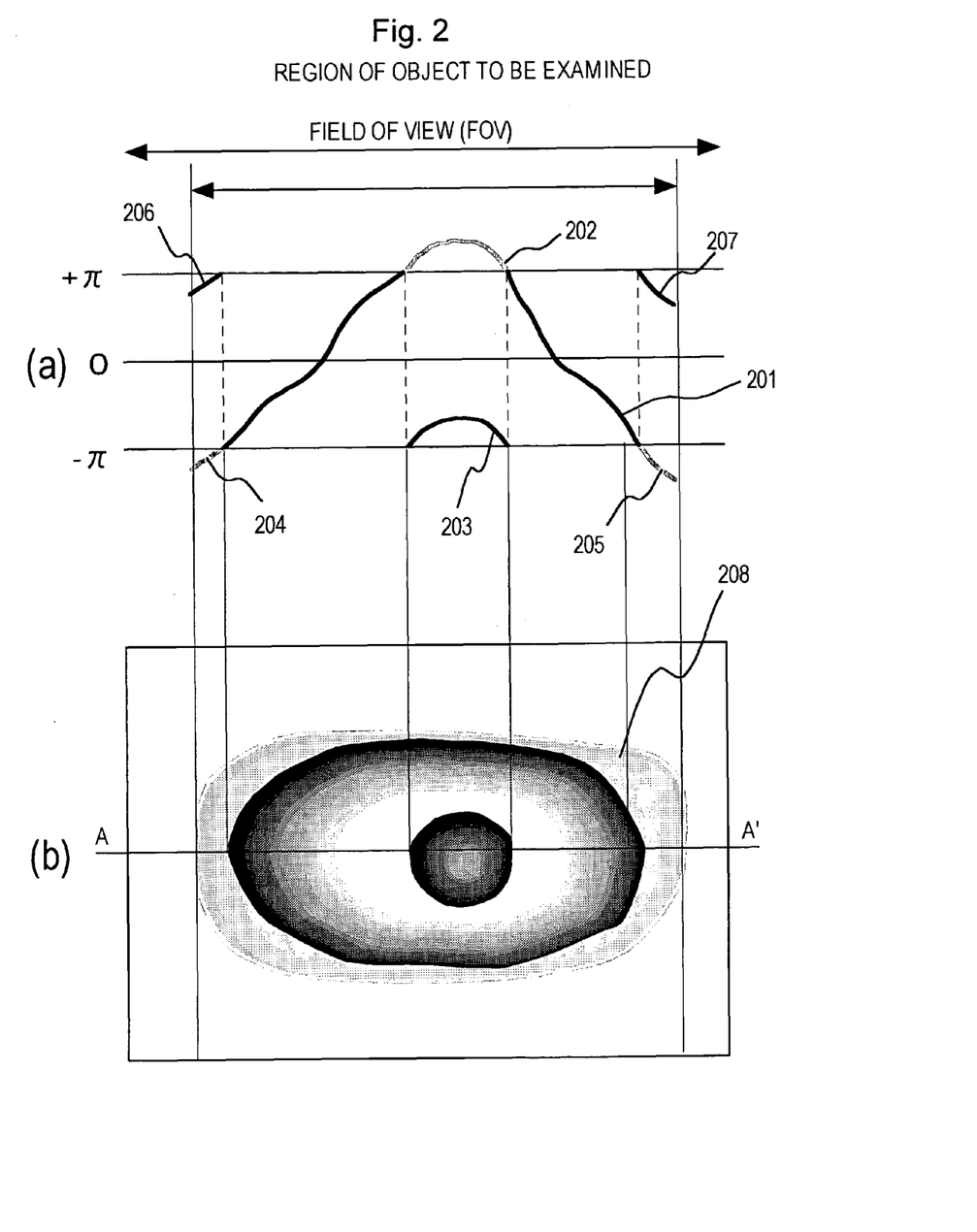
FIG. 2(a) is a graph and FIG. 2(b) is a map illustrating the conventional static magnetic field inhomogeneous distribution within an FOV.

FIG. 2(b) is a static magnetic field inhomogeneity map obtained in imaging an object 208, and FIG. 2(a) is a graph where phase values along the line A-A' are plotted. In FIG. 2(a), the horizontal axis represents the position, and the vertical axis represents a rotation amount of the phases caused by inhomogeneity of the static magnetic field. The graph shows a distribution 201 of the phase rotation amount caused by the static magnetic field inhomogeneity inside the object. Since the signal component outside the object 208 is substantially 0 and the phase value becomes measurement-noise (random phase), a threshold absolute value of the signal is provided. The phase values of a portion where the signal value is smaller than a constant value are not used.

In FIG. 2(a), phase values 202 that are +π or more are wrapped to provide a value 203. Values 204 and 205 that are −π or less are also wrapped to provide values 206 and 207 between −π and +π. Thus, the phase value discontinuously jumps from −π to +π (the lighter lines in the figure) in the wrapped area. However, the actual magnetic field does not jump discontinuously in such a manner. Consequently, the unwrapping processing mentioned in U.S. Pat. No. 5,701,074 is performed so as to obtain a smooth static magnetic field inhomogeneity map, eliminating the discontinuous jump.

Figure 6:
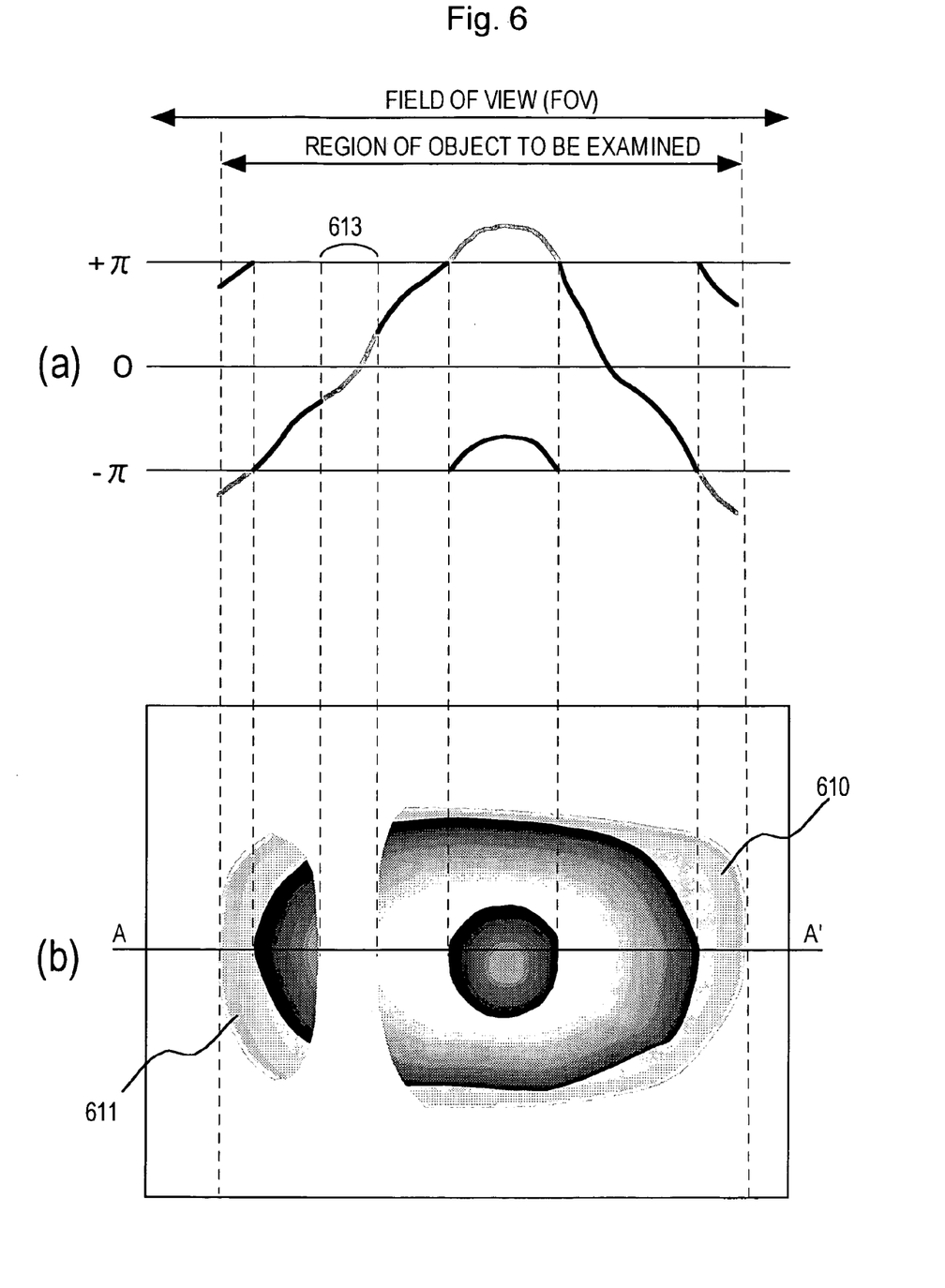
FIG. 6(a) is a graph and FIG. 6(b) is a map illustrating a static magnetic field inhomogeneous distribution within the FOV of an object to be examined, which includes a plurality of portions that are spatially separated.

Two separated objects to be unwrapped are shown in FIG. 6(b). FIG. 6(b) shows a static inhomogeneous magnetic field map, where the region having the larger area is a first region 610 and the region having the smaller area is a second region 611. FIG. 6(a) is a graph where the phase values along the line A-A' in FIG. 6(b) are plotted. In FIG. 6(a), the horizontal axis represents the position, and the vertical axis represents an amount of phase rotation caused by the static magnetic field inhomogeneity. Between the first region 610 and the second region 611, there is exists an air gap 613.

Figure 3A:
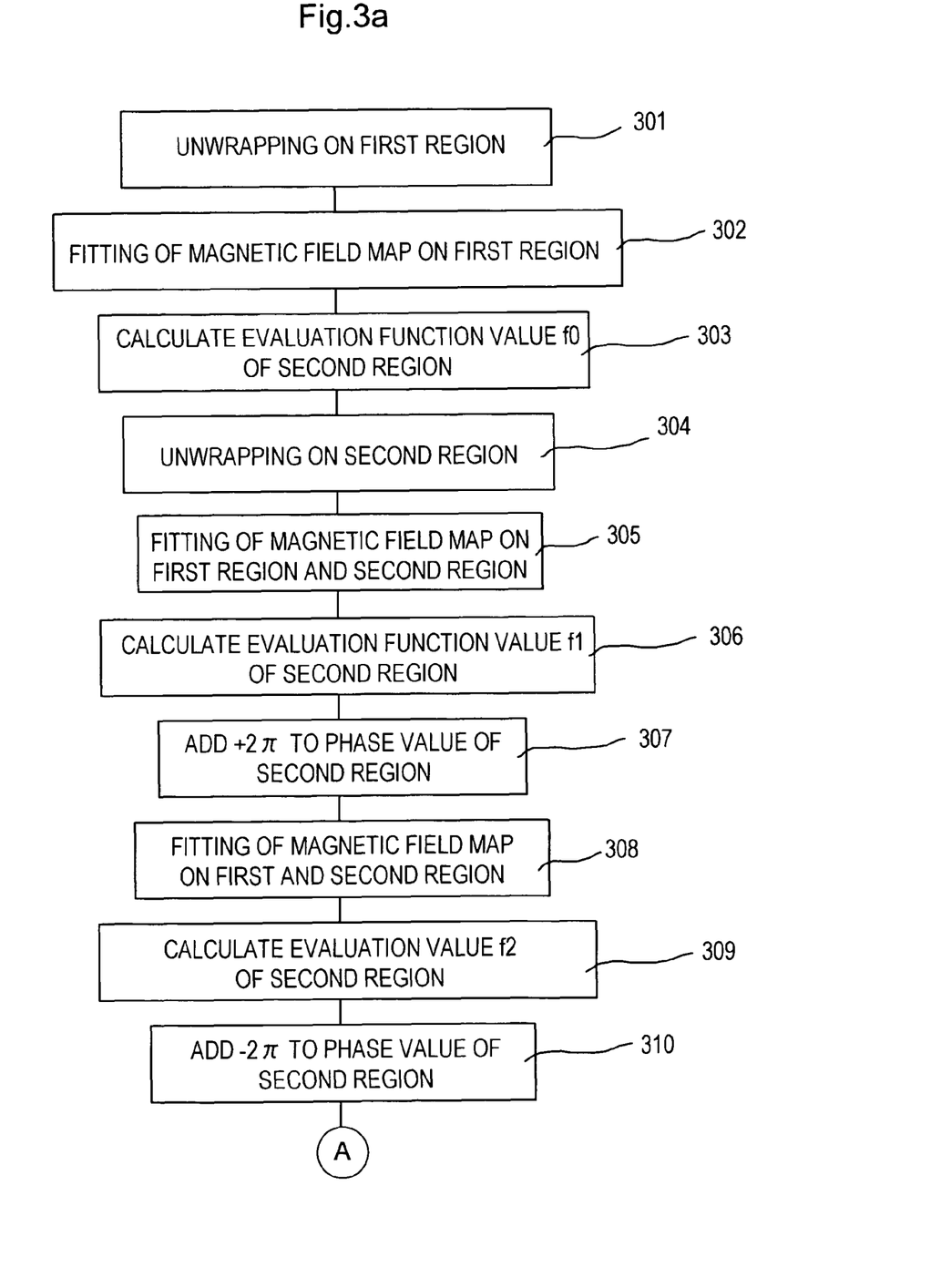
FIGS. 3(a) and 3(b), when combined, constitute a flow chart illustrating the cross-region unwrapping algorithm according to the present invention.
Figure 3B:
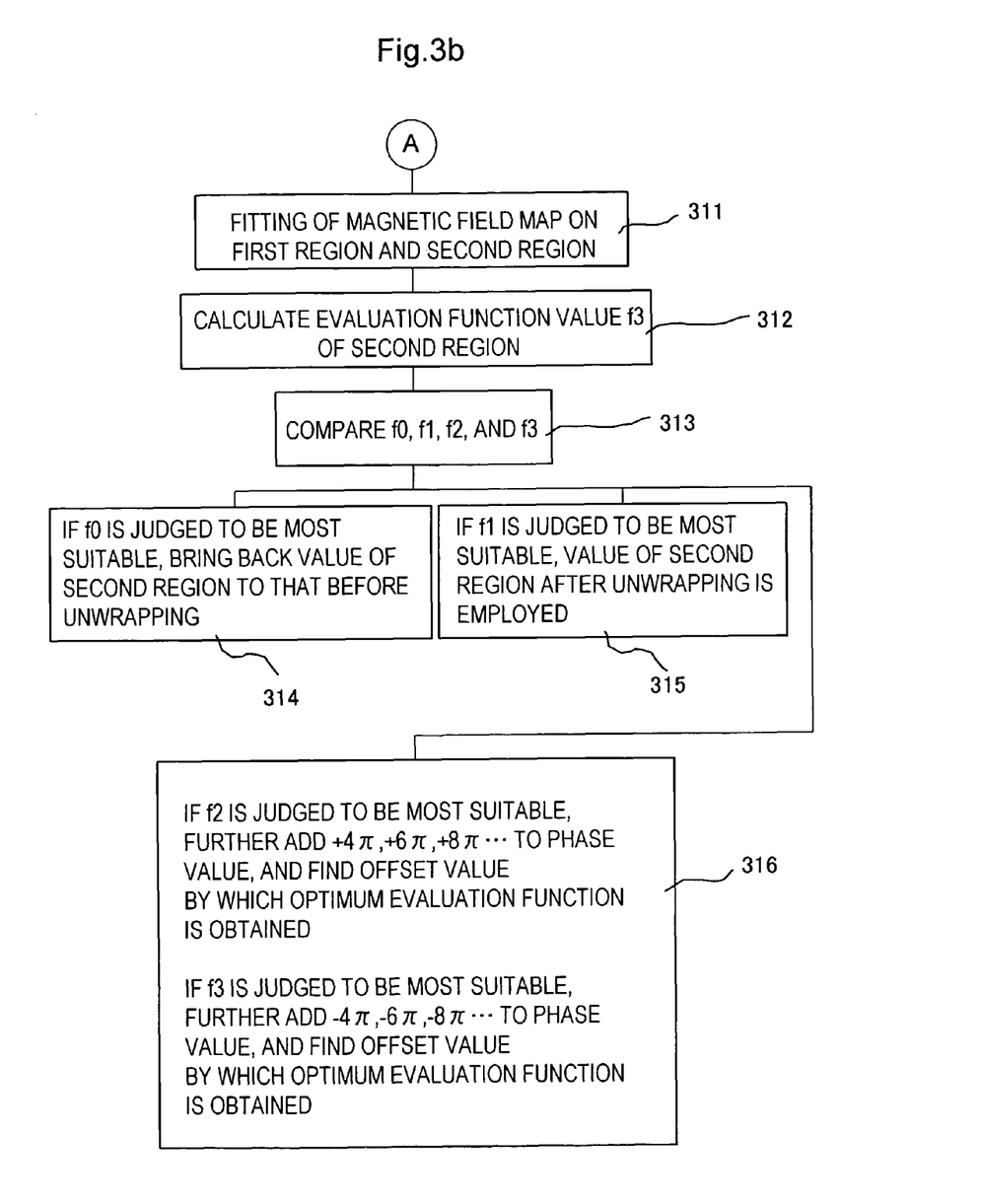

The cross-region unwrapping algorithm, illustrated by a flowchart in FIGS. 3a and 3b, is applied to such a processing object. Fitting is performed for calculating an approximate function of the phase values of the first region, the phase values of the second region is calculated, and then the unwrapping is performed.

The cross-region unwrapping algorithm, illustrated by the flowchart in FIGS. 3a and 3b, is also applied. First, the first region 610 is subject to the cross-region unwrapping (301). Next, two-dimensional fitting is performed only on the phase values of the first region 610 after the unwrapping (302). According to this embodiment, the fitting degree is four, for example, and an evaluation value f0 is calculated from an evaluation function based on the fitting result in the second region 611 (303). The evaluation function is a square-sum (SD: Standard Deviation) of a difference between the above fitting result and the phase values of the second region before the fitting, for example.

Then, the cross-region unwrapping is performed on the second region 611 (304). Next, the fitting is performed on the phase values of the first region 610 after the unwrapping and the phase values of the second region after the unwrapping (305). Then, an evaluation value f1 is calculated from the evaluation function in the same manner (306). In the step 306, the evaluation value is calculated using the square-sum of the difference between the phase values before and after the fitting, as in the step 303.

Then, the phase values of the second region after the cross-region unwrapping is given an offset of +2π (307), the fitting is performed in the same manner (308), and thus, the evaluation value f2 is calculated (309). Further, the phase values of the second region after the cross-region unwrapping is given an offset of −2π (310), the fitting is performed (311), and an evaluation value f3 is calculated in this state (312). Here, the thus-calculated evaluation values f0, f1, f2, and f3 are compared, and it is judged which value is most suitable (313).

In another method, the unwrapping is not performed firstly on the first region. Rather, the fitting is performed on the phase values of the first region and an evaluation function of the second region is calculated. Then, the unwrapping is performed on the phase values of the first region and the second region, and the evaluation functions of the respective regions are compared. Then, it is judged which value is most suitable. The manner of this comparison is the same as that provided in FIG. 3b.

Figure 4:
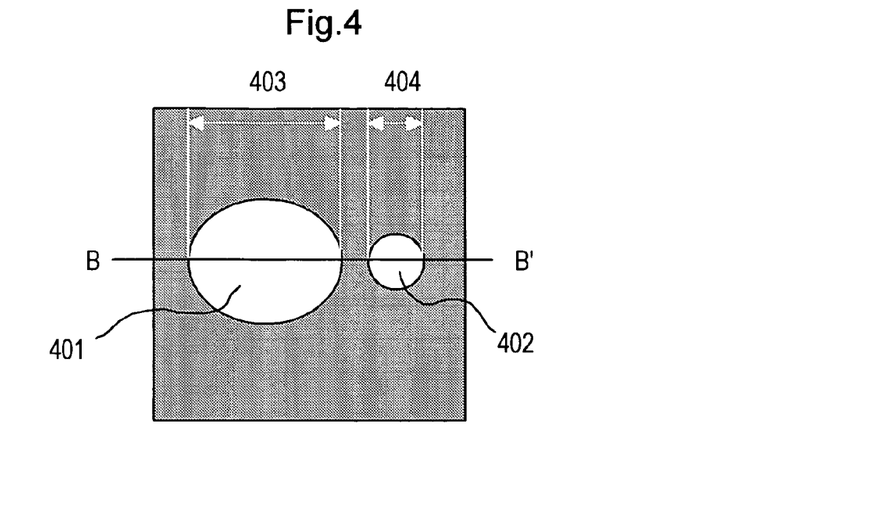
FIG. 4 is a diagram showing an image of an object to be imaged, which includes a plurality of portions that are spatially separated.
Figure 5:
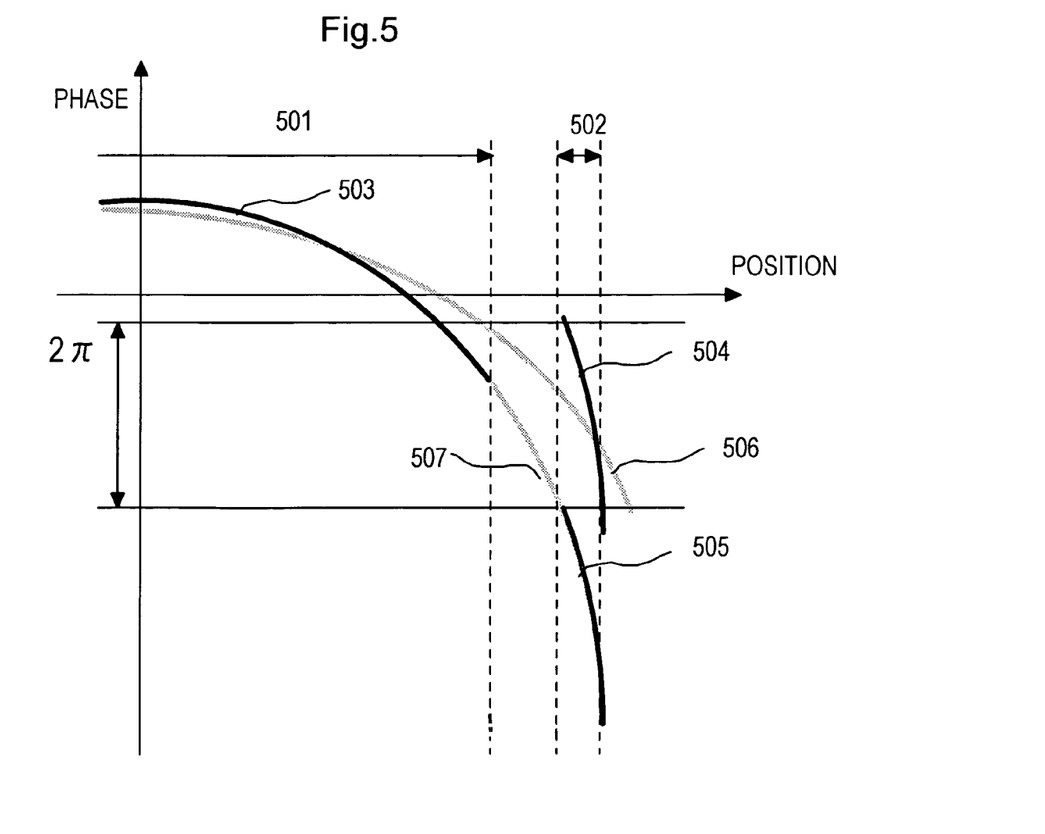
FIG. 5 is a graph showing the phase profile of an image of an object to be examined, which includes a plurality of portions that are spatially separated.

In the judgment step, the smallest square-sum is selected, for example. This process will be described in more detail with reference to FIG. 4 and FIG. 5. FIG. 4 shows an image of an object to be examined having two portions 401 and 402 that are spatially separated, and FIG. 5 shows a profile of phases of this image along the line B-B'. Areas 403 and 404 shown in FIG. 4 correspond with areas 501 and 502 shown in FIG. 5. A curve 503 represents the result of the phase unwrapping in the area 501. The curve 504 represents the result of the cross-region unwrapping in the area 502 using the above-mentioned cross-region unwrapping processing. The curve 504 has an offset of 2nπ, which means that the actual phase is represented by the curve 505. A curve 506 and a curve 507 represent the result of the fitting using the curve 503 and the curve 504, and using the curve 503 and the curve 505, respectively.

Here, when the curve 504 and the curve 506, and the curve 505 and the curve 507 are respectively compared, the trajectory of the curve 505 substantially coincides with that of the curve 507. On the other hand, the trajectory of the curve 504 is greatly different in values from that of the curve 506 in the area 502. Accordingly, it is judged that the state, where the square-sum of the difference between the phases after the cross-region unwrapping and the fitting result is minimum, is most suitable.

As a result of judgment in the step 313, if it is judged that the evaluation value f0 is most suitable; that is, the phase values before the cross-region unwrapping in the second region are most suitable, the values are changed back to the values before cross-region unwrapping in the second region (314). If it is judged that the evaluation value f1 is most suitable; that is, the phase values after cross-region unwrapping in the second region are most suitable, the value after cross-region unwrapping in the second region is employed (315). If it is judged that the evaluation value f2 is optimum; that is, the phase values that are given an offset of +2π after the unwrapping in the second region are most suitable, the evaluation value fn is calculated while changing the offset value to +4π, +6π, ..., so as to find the optimum offset value, and the thus-calculated offset value is employed (316). Similarly, if the evaluation value f3 is most suitable; that is, the phase values that are given an offset of −2π are most suitable, the values of the evaluation function are calculated while changing the offset value to −4π, −6π, ..., so as to find the optimum offset value, and the thus-calculated offset value is employed (316).

Figure 7:
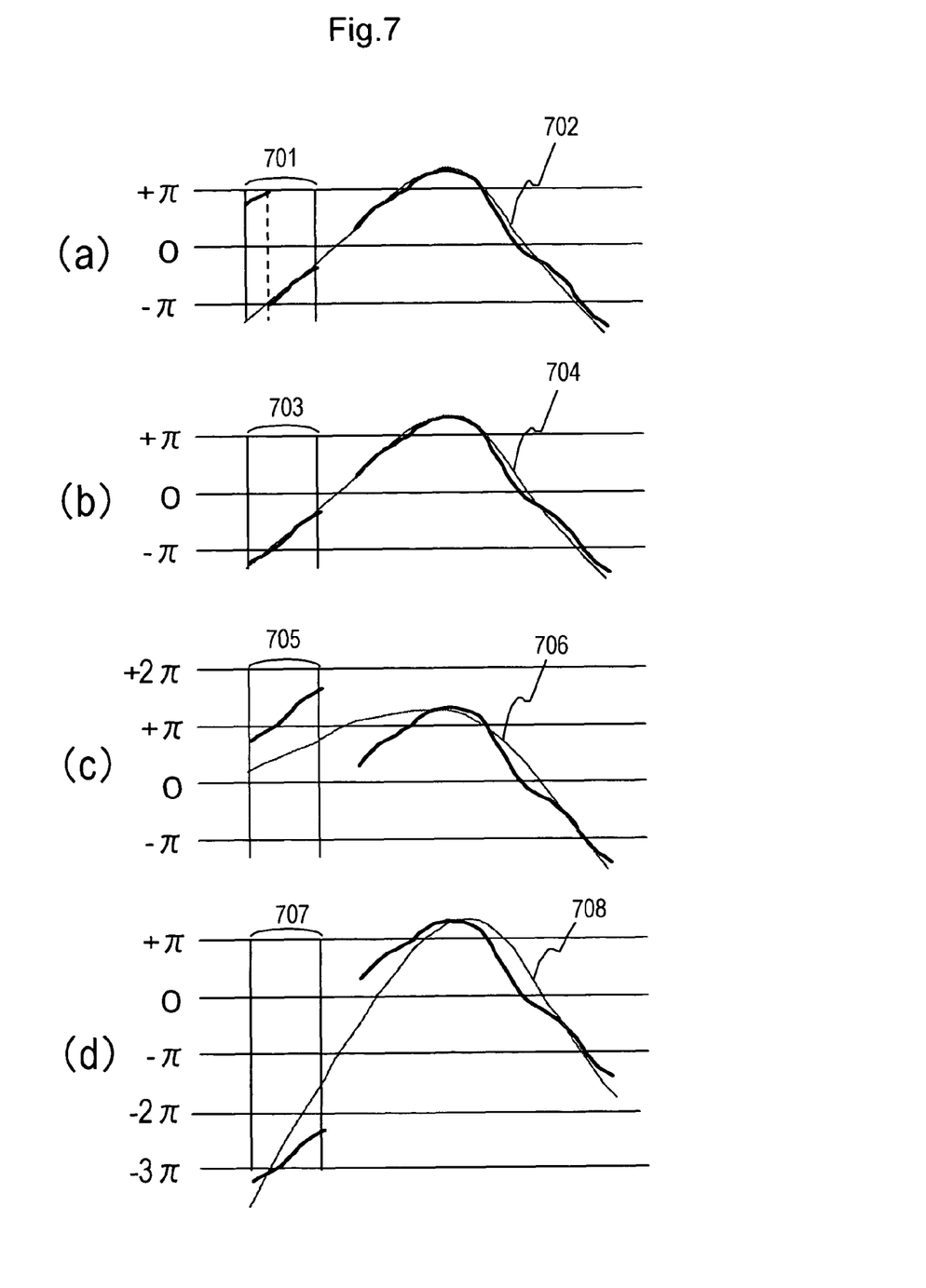
FIG. 7 is a series of graphs comparing evaluation values according to the invention.

The process of the above-described judgment is schematically shown in FIG. 7, wherein the graph (a) shows the result of the steps 301 and 302. When the difference between a heavy line (actual phase value) and a thin line (fitting result) in the zone 701 is large, the evaluation value f0 becomes large. The graph (b) shows the result of the steps 304 and 305, wherein the values of the heavy line are very close to those of the thin line 704, and the evaluation value f1 becomes small. The graphs (c) and (d) show the result of the steps 307 and 308, and the result of the steps 310 and 311, respectively. The difference between the heavy line and the thin line 706 in the zone 705 and that between the heavy line and the thin line 708 in the zone 707 are large, and the evaluation values f2 and f3 also become large. In the example shown in FIG. 7, the evaluation value f1 is minimum, and the step 315 is found most suitable as a result of the comparison and judgment in the step 313.

When the above-described processing was applied to simultaneous imaging of left and right crural regions (transverse cross-section or coronal cross-section), multi-slice imaging of an abdominal transverse cross-section or an abdominal coronal cross-section, imaging with a large FOV, imaging of a head transverse cross-section, imaging of ankles, and the like, and three-hundred or more images were taken, the cross-region unwrapping was normally performed on all images and water/fat separated images without artifacts were obtained. Further, this method can be applied to both the three-point Dixon method of the gradient echo type and the three-point Dixon method of the spin echo type.

Incidentally, another evaluation function and judging formula may include the following examples:

(a) It is judged, when the fitting is performed on the phase rotation amount distribution map based on the static magnetic field inhomogeneity using a polynomial equation, whether or not all coefficients of the respective highest degree terms are the predetermined threshold value or less. If they are the threshold value or less, they are regarded as being right.

(b) In the above-described fitting, the square-sum of the coefficients of the highest-degree terms is calculated, and the minimum value among them is employed.

Here, (a) is based on the reasoning that a static magnetic field generated by a magnet gently changes; the phase map thereof does not have local change; and a coefficient of a high-degree term does not have a large value in the fitting result. In the actual processing, quadric fitting is performed, wherein the coefficients of quadric terms (x4, x3y, x2y2, xy3, and y4) are regarded as being right if they are a certain value or less. As a result of experiments, the processing can be stabilized, to some extent, by using this evaluation function. Incidentally, the optimum threshold value changes depending on the FOV and the portion imaged.

(b) is an improvement of (a), wherein a threshold is not provided in advance, but values of the evaluation function in the respective states are compared so as to judge which state is most suitable. With this method, a stabler result than that brought about by (a) can be obtained. In this case, for the same reason as applied to (a), the state where the value of (b) is minimum was regarded to be most suitable. In the same manner as (a), the processing result depended on imaging conditions.

In the above-described embodiments, among the island-like regions, the designation of the first region and the second region may be determined by a method other than comparison of their size. For example, the island-like region which is nearer the center of the image may be made the first region, and the other island-like region in the peripheral part may be made the second region. That is, it is important for performing the unwrapping rapidly and stably to start the unwrapping from the region which has a larger area and is nearer the center of the image in the processing order.

To calculate the evaluation function, the square-sum of the difference between the phases before and after the fitting in the second region is calculated. However, it also may be preferable to calculate the square-sum of the difference between the phases before and after the fitting in both the first and the second regions. In this case, not only the local fitting condition but also the fitting effect over the whole object is evaluated. However, since the area of the evaluated portion increases and the calculation of the evaluation value takes more time, more rapid processing is necessary.

Further, according to the above-described embodiment, the number of island-like regions to be unwrapped is two; however, the embodiment also can be applied when three or more island-like regions exist. In this case, a stable result can be obtained in a short time by employing a method where, after the cross-region unwrapping between the first region and the second region is completed, the cross-region unwrapping is performed on a third region. The evaluation value for the third region is calculated by the cross-region unwrapping between the first region and the second region, that is, from the evaluation function based on the phase values that are adjusted between the first region and the second region. Further, when a fourth region exists, the evaluation value is calculated from the evaluation function based on the phase values adjusted among the first to the third regions. Further, it is also preferable that, in the same way as evaluating the fitting effect of the combined first and the second regions, a square-sum of the difference of the phases before and after the fitting in the combined first and the ath (a is an integer, which is three or more) regions, so as to evaluate the fitting effect in the whole body of the object.

It is necessary to fully consider how large the island-like region to be unwrapped can be for stably operating the processing. This can be easily judged by considering how advantageous it is to include a small island-like region, that is located at an edge of the image, in the calculation of the static magnetic field map. Typically, it is desirable that, in an image of 256×256, an island-like region including 100 pixels or less is disregarded and not used for determining the static magnetic field map. The reason for this is that a very small region might be a bloodstream artifact or a body-movement artifact, the phase values of which are unlikely to reflect the static magnetic field distribution. Even if an evaluation value (square-sum) is calculated for a small island-like region, there is no guarantee that the calculated value will be accurate. Further, since the effect brought about by such a small region on the entire fitting function is slight, the small region does not have much effect on the result of the static magnetic field distribution. Further, when the number of island-like regions increases, it is necessary to consider an extension of the calculation time. Further, the location is a criterion because the clinical importance of objects near the edge of the image is less. It is also effective to limit the number of island-like regions to be unwrapped. For example, only five island-like regions in descending order of the number of pixels are chosen for calculation. Such a limitation has the advantage of limiting the calculation time within a certain range.

Further, according to the above-described embodiment, a quadric fitting function is used; however, the degree of the function may be varied. In this case, the following factors need to be considered in the determination of the degree: when the degree is small, the static magnetic field inhomogeneity map of the acquired fitting result forms a smooth line, and the processing result is stabilized. However, there is a disadvantage in that, with a low degree, the function cannot follow the local fluctuation of the magnetic field. For example, it is well known that in an MRI apparatus employing an open magnet, the magnetic field uniformity is generally deteriorated dramatically at the position farther from the magnetic field center. Therefore, when the size of the field of view (FOV) is increased and imaging is performed at a position other than the magnetic field center, the fluctuation of the static magnetic field cannot be accurately calculated. As a result, water and fat are mixed in a water/fat separated image whose static magnetic field is corrected, whereby the accuracy of clinical diagnosis is dramatically deteriorated. Further, it is known that, in a region where an air space is complicatedly confusing, such as a nasal cavity, or a paranasal cavity, the static magnetic field locally fluctuates. In such a region also, the fitting cannot be accurately performed with a small degree. On the other hand, although those problems are solved by increasing the fitting degree, the fitting result is diverged around the object and may become unstable. Further, the calculating time of the fitting is likely to be extended. In light of this experience, the inventors obtained a good result using a quadrate fitting function. More specifically, in an open MRI apparatus, the processing can be stably performed up to an FOV of 320 mm.

The reason why island-like regions to be unwrapped appear is, as described above, because pixels having a small absolute value are regarded as noise and are excluded from the object being calculated. Although such handling is regarded as quite natural for people in the same business, it is necessary to fully consider where to set the threshold value for stably performing processing. Typically, 5% to 40% of the maximum value of the signal in an image is desirable. If the threshold value is too large, the area of each island-like region becomes small, and the accuracy of the static magnetic field inhomogeneity map to be calculated is deteriorated, since the map is created with little data. Further, the number of the island-like regions is likely to increase. If the threshold is small, the number of regions to be separated is reduced; however, since noise components are mixed in, the accuracy of the static magnetic field inhomogeneity map is deteriorated. According to the investigation by the inventors, it is preferable to set the threshold value in the range from 10% to 30% for stably performing processing.

The number of island-like regions also depends on the characteristics of the echoes to be measured. When a phase map is created by calculation using in-phase echoes of water and fat, the number of the island-like regions is reduced. However, when out-phase echoes of water and fat are used in the calculation for creating the phase map, the number of the island-like regions increases. The reason for this is that, in pixels where water and fat mix in an out-phase image, the respective signal components cancel each other, and thus the signal value becomes small. Consequently, to stably create the static magnetic field inhomogeneity map, it is most preferable to use both in-phase echoes and the phase unwrapping between island-like regions according to the invention. The stability and accuracy of the processing also can be greatly improved in comparison with the conventional processing, even when the invention is used with out-phase echoes, as described above. Further, the invention also may be applied when a static magnetic field inhomogeneity map is calculated from the phase difference between in-phase echoes and out-phase echoes. As a result of actually applying the invention to such data, the unwrapping processing on an image of a brain-basilar region, an abdominal transverse cross-section, and an abdominal coronal cross-section, was dramatically improved.

It is also important in which order the island-like regions are unwrapped. Experimentally, it was found that it is preferable to start the unwrapping from a region near the center of the image. The reason for this is that, since the image center often coincides with the magnetic field center, the static magnetic field uniformity is high and the number of unwrapping in air gap is small, so that the obtained result is likely to be accurate. Otherwise, the unwrapping is preferably performed from a larger island-like region. The reason for this that, since the accuracy of the evaluation value is high in a large island-like region, as described above, judgment is performed accurately, and the obtained result is likely to be accurate. Further, the unwrapping is preferably performed from an island-like region that has a smaller air gap with a region that has already been unwrapped, since the number of the unwrapping operations in the air gap is correspondingly small, and the obtained result is likely to be accurate. That is, the unwrapping is applied, starting with the region where a more accurate result is likely to be obtained. Since all of those processing orders can be described with simple equations, the automation of the processing is not interrupted.

According to the above-described embodiments, the fitting is used at a preliminary stage of calculating the evaluation value. Although a method of comparing the fitting result with the original data is one example of the appropriate methods, the invention is not limited thereto. That is, it is also preferable that, when the unwrapping is performed between island-like regions, a plurality of unwrapping conditions are hypothesized, judgment is made on the respective results based on these conditions using an evaluation function, and an evaluation value that is likely to be most suitable, that is, the most suitable unwrapping condition, is employed.

Since the present invention is constructed as described above, even when a region to be unwrapped is separated into island-like regions, the cross-region unwrapping is properly performed. Therefore, since the phase rotation amount is accurately calculated, artifacts can be suppressed so that a region where a water signal is extracted and a region where a fat signal is extracted do not mix in one image.

What is claimed is:

1. A magnetic resonance imaging apparatus comprising:
   static magnetic field generating means for generating a static magnetic field in space where an object to be examined is placed;
   RF pulse applying means for repeatedly applying an RF pulse that generates nuclear magnetic resonance phenomenon to the object;
   gradient magnetic field generating means for applying gradient magnetic fields in a slicing direction, a phase-encoding direction, and a readout direction, respectively;
   receiving means for detecting a plurality of echo signals from the object; and
   control means for controlling each means so as to generate a plurality of echo signals having various echo times within one repetition time of the RF pulse, to apply a readout gradient magnetic field in parallel with the generation of each echo signal, and to vary the phase encoding at each repetition,
   wherein said control means executes first unwrapping processing on each region of an image having separated regions for adjusting phase values in each region, and executes second unwrapping processing for adjusting phase values between each region, in which a plurality of patterns of phase value adjustment are created, a desirable pattern is selected from among the plurality of patterns, and the phase values are adjusted by the selected pattern so that the phase values of each region are approximated by one curve, and
   wherein said regions are spatially and discontinuously separated by a noise region where pixels have smaller absolute values than a predetermined threshold value.

2. An image processing method for image-processing a plurality of images having various echo times so as to obtain an image where water and fat are separated, comprising the steps of:
   (a) performing unwrapping processing on a region to be a standard region in an image, which includes a plurality of discontinuously separated regions, for calculating a distribution map of a phase rotation amount caused by static magnetic field inhomogeneity;
   (b) performing fitting processing on the distribution map of the phase rotation amount caused by static magnetic field nonuniformity in the standard region;
   (c) calculating an evaluation value from phase values of a first region that is adjacent to the standard region and phase values of the standard region acquired in the step (b), (d) performing unwrapping processing on the first region;
(e) performing fitting processing on the standard region and the first region;
(f) calculating an evaluation value from the phase values of the standard region and the first region and the phase values of the standard region and the first region acquired in the step (e);
(g) giving a desired offset to the first region;
(h) performing fitting processing on the standard region and the first region;
(i) calculating an evaluation value from the phase values of the standard region and the first region and the phase values of the standard region and the first region acquired in the step (h);
(j) repeating a desired number of times the steps (g) to (i) while varying the offset value;
(k) comparing a plurality of evaluation values obtained in repetition of the steps (c), (f), (i), and (j);
(l) selecting a desired evaluation value on the basis of a comparison result obtained in the step (k); and
(m) adjusting the phase values of the standard region and the first region on the basis of the evaluation value selected in the step (l) so that the phase values of each region are approximated by one curve;
creating an image, based on the steps (a)-(m), where water and fat are separated;
outputting the created image to a display unit,
wherein the first region and the standard region are spatially and discontinuously separated by a noise region where pixels have smaller absolute values than a predetermined threshold value.

3. An image processing method according to claim 2, further comprising a step, in a case where three or more island-like regions exist, of
(n) setting a new standard region that is constituted of the standard region and the first region, the phase values of which have been adjusted in the step (m), and repeating the steps (a) to (n).

4. A magnetic resonance imaging apparatus comprising:
a magnet for generating a static magnetic field around an object to be examined;
a gradient magnetic field coil for generating gradient magnetic fields;
an RF coil for generating an RF magnetic field;
an RF probe for detecting magnetic resonance signals generated from the object; and
control means for controlling operation of said magnet, said gradient magnetic field coil, said RF coil, and said RF probe to acquire image data from the object to be examined,
wherein said control means is configured to:
create a single image including a region that is separated into at least two or more portions,
calculate evaluation functions of respective phase values of a first region and a second region facing the first region,
adapt the phase values of the second region to the phase value of the first region based on the evaluation function so that the phase values of each region are approximated by one curve, and
obtain a water/fat separated image of the first region and the second region, and
wherein the first region and the second region are spatially and discontinuously separated by a noise region where pixels have smaller absolute values than a predetermined value.

5. A magnetic resonance imaging apparatus according to claim 4, wherein said control means corrects phase rotation caused by static magnetic field inhomogeneity between the first region and the second region, and calculates evaluation functions of the phase values of the respective regions.

6. A magnetic resonance imaging apparatus according to claim 4, wherein the control means selects a region located near the center of the image, as the first region.

7. A magnetic resonance imaging apparatus according to claim 4, wherein the control means selects a largest area in the image, as the first region.

8. A magnetic resonance imaging apparatus according to claim 4, wherein the control means selects a region having a narrow gap with the first region from among all regions, as the second region.

9. A magnetic resonance imaging apparatus according to claim 4, wherein, when phase values of an nth (n is an integer, which is three or more) region are calculated, the control means applies the phase value of the nth region to an approximating function of the combination of all the regions from the first region to the nth region.

10. An image processing method for image-processing on a plurality of images so as to obtain an image where water and fat are separated, comprising the steps of:
(a) performing unwrapping processing on a first region in a single image including a plurality of separated regions for calculating a distribution map of a phase rotation amount caused by static magnetic field inhomogeneity;
(b) performing fitting processing on the distribution map of the phase rotation amount caused by the static magnetic field inhomogeneity in the first region; and
(c) calculating an evaluation value from phase values of a second region adjacent to the first region and the phase values of the first region acquired in the step (b);
(d) adjusting the phase values of the first region and the second region on the basis of the evaluation value calculated in the step (c) so that the phase values of each region are approximated by one curve;
creating an image, based on the steps (a)-(d), where water and fat are separated;
outputting the created image to a display unit,
wherein the first region and the second region are spatially and discontinuously separated by a noise region where pixels have smaller absolute values than a predetermined threshold value.

11. An image processing method according to claim 10, further comprising steps of:
(d) performing unwrapping processing on the second region;
(e) performing fitting processing on the first region and the second region; and
(f) calculating an evaluation value from phase values of the first region and the second region and phase values of the first region and the second region acquired in the step (e).

12. An image processing method according to claim 11, further comprising a step of:
(g) giving an offset of ±2mπ (m is a natual number) to the phase values of the second region, and thus calculating an evaluation value.

13. An image processing method according to claim 12, further comprising a step of:
(j) comparing evaluation functions of a plurality of evaluation values acquired in the steps (c), (f), and (g), and selecting a desired evaluation value.

14. An image processing method according to claim 13, further comprising a step of:
(h) performing fitting processing on the phase values of the first region and the second region and phase values of the xth (x is an integer, which is three or more) region.

* * * * *